US012665008B2

(12) United States Patent
Huang et al.

(10) Patent No.: US 12,665,008 B2
(45) Date of Patent: Jun. 23, 2026

(54) MRAM LAYOUT

(71) Applicant: UNITED MICROELECTRONICS CORP., Hsin-Chu City (TW)

(72) Inventors: Wen-Liang Huang, Taoyuan City (TW); Cheng-Tung Huang, Kaohsiung City (TW); Ting-Hao Chang, Kaohsiung City (TW); Chien-Yu Ko, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 195 days.

(21) Appl. No.: 18/798,848

(22) Filed: Aug. 9, 2024

(65) Prior Publication Data

US 2026/0024566 A1     Jan. 22, 2026

(30) Foreign Application Priority Data

Jul. 18, 2024     (TW) ................................. 113126824

(51) Int. Cl.
| | |
|---|---|
| *G11C 11/16* | (2006.01) |
| *H10B 61/00* | (2023.01) |
| *H10N 50/10* | (2023.01) |
| *H10N 50/80* | (2023.01) |

(52) U.S. Cl.
CPC ........ *G11C 11/161* (2013.01); *G11C 11/1655* (2013.01); *G11C 11/1657* (2013.01); *G11C*

*11/1659* (2013.01); *H10B 61/22* (2023.02); *H10N 50/10* (2023.02); *H10N 50/80* (2023.02)

(58) Field of Classification Search
CPC .............. G11C 11/161; G11C 11/1655; G11C 11/1657; G11C 11/1659; G11C 11/1675; H10B 61/22; H10N 50/10; H10N 50/80
See application file for complete search history.

(56) References Cited

U.S. PATENT DOCUMENTS

| | | | | |
|---|---|---|---|---|
| 11,238,912 B1 * | 2/2022 | Wu | ...................... | G11C 11/1657 |
| 12,178,052 B2 * | 12/2024 | Wu | ........................ | H10B 61/22 |

FOREIGN PATENT DOCUMENTS

| | | |
|---|---|---|
| TW | 202415246 A | 4/2024 |

* cited by examiner

*Primary Examiner* — Allison Bernstein
(74) *Attorney, Agent, or Firm* — Winston Hsu

(57) ABSTRACT

A MRAM layout is provided in the present invention, wherein each memory cell includes a first word line, a third word line and a second word line spaced apart on a substrate in order and extending in a first direction over active areas, a first MTJ in BEOL metal layers with one terminal connected to a second active area and another terminal connected to a first bit line, a second MTJ in the BEOL metal layer with one terminal connected to a third active area and another terminal connected to a second bit line, wherein the first bit line and the second bit line are in different metal levels of the BEOL metal layer, and a source line is connected to a first active area and a fourth active area.

11 Claims, 6 Drawing Sheets

MRAM LAYOUT

BACKGROUND OF THE INVENTION

1. Field of the Invention

The present invention relates generally to a magnetoresistive random access memory (MRAM) layout, and more specifically, to a MRAM layout with bit lines in different metal levels.

2. Description of the Prior Art

Magnetoresistive random access memory (MRAM) is a kind of emerging memory highly-anticipated in recent years, combining the advantages of all kinds of existing memory. For example, MRAM has an access speed comparable to SRAM, with non-volatility and low power consumption like Flash, and with high integrity and durability like DRAM. More important, the process of MRAM devices may be integrated in currently available semiconductor BEOL (back-end-of-line) processes. Therefore, it has a potential to become primary memory used in semiconductor chips nowadays. The storage device of MRAM is usually set in a level between a lower interconnect and an upper interconnect, including magnetic tunnel junctions (MTJs) cooperating with one or more transistors to control circuit switch during read/write operation. Unlike conventional memory using electric charge to store data, an external magnetic field is usually applied in the write operation of MRAM to control the polarization direction of MTJs and obtain different tunnel magnetoresistances (TMR), so that corresponding storage states may be defined to store digital data.

In response to the continuous miniaturization demand of various electronic produces nowadays, how to accommodate more memory cells in a limited layout area and to scale the memory cells through circuit design for improving layout utilization become research interests for those of skilled in the art, especially with the scaling of memory cells, it becomes increasingly difficult to set the same number of bit lines in a metal level, since it may violate the design rule. Accordingly, how to overcome this problem through modifying the layout design of memory circuit is already an important topic for those of skilled in the art to research and develop, in hope of applying MRAM more widely and maturely in memory field.

SUMMARY OF THE INVENTION

In the light of the demands for miniaturizing existing memory cells and increasing memory capacity in unit layout area, the present invention hereby provides a novel MRAM circuit and relevant layout, with features of bit lines connected by memory cells being designed in different metal levels, so that the dimension of memory cell will not be limited by minimum design rule of bit lines and the memory capacity in unit layout area may be improved.

The objective of the present invention is to provide a MRAM layout with multiple memory cells, wherein each of the memory cells includes: a substrate with multiple active areas formed thereon; a first word line, a third word line and a second word line spaced apart in a second direction on the substrate and extending in a first direction over the active areas, wherein the active area at an outer side of the first word line is first active area, the active area between the first word line and the third word line is second active area, the active area between the third word line and the second word line is third active area, and the active area at an outer side of the second word line is fourth active area; a first MTJ in BEOL metal layers with one terminal connected to the second active area and another terminal connected to one first bit line; a second MTJ in BEOL metal layers with one terminal connected to the third active area and another terminal connected to one second bit line, wherein the first word line and the second word line are in different metal levels of the BEOL metal layers; and a source line connected to the first active area and the fourth active area, wherein a source line, the first bit line and the second bit line extend in the second direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
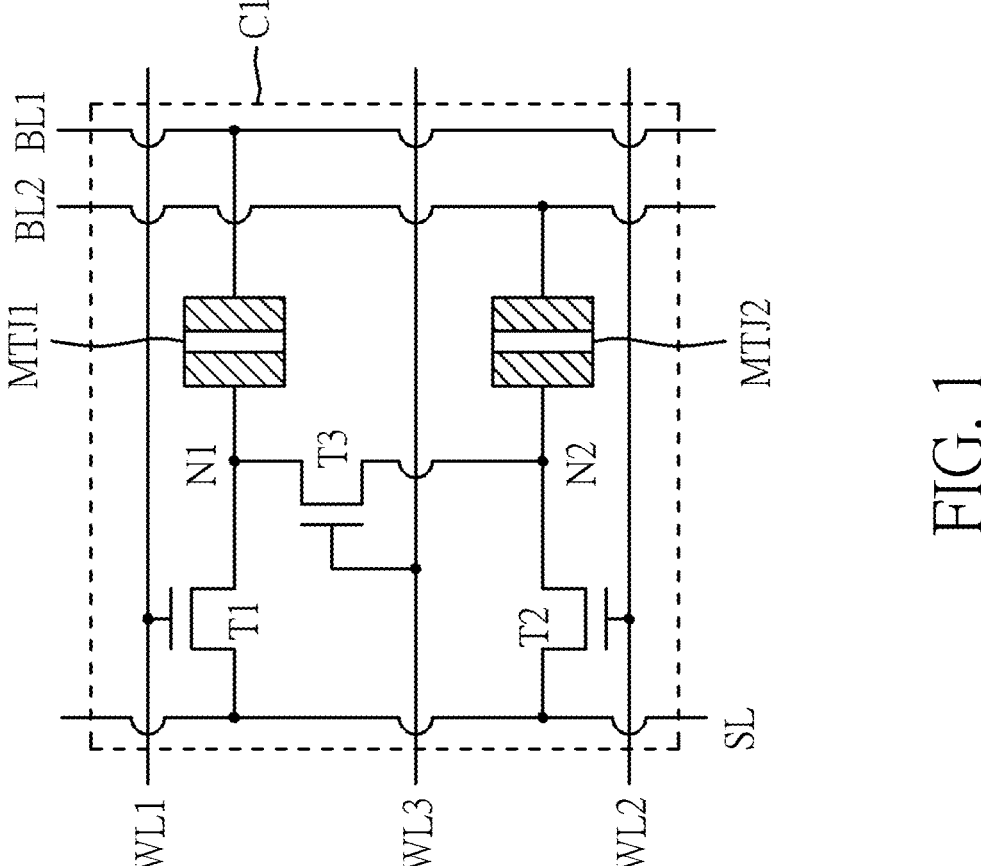
FIG. 1 is a circuit diagram of a MRAM cell in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). In addition, spatially relative terms (e.g., "beneath," "below," "lower," "above," "upper" and the like) may be used herein for ease of description to describe one element or a relationship between a feature and another element or feature as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Firstly, please refer to FIG. 1, which is a circuit diagram of a MRAM in accordance with the preferred embodiment of present invention. This embodiment takes a 3T2M (three transistors and two memory devices) MRAM architecture as an example to describe components and the interconnections therebetween in the MRAM circuit of present invention. Although the memory cell shown in the embodiment is provided with only two storage devices, please note that there might be more storage devices included in a memory cell in actual implementation. The scope of present invention is not limited thereto and should be defined by accompanying claims.

The MRAM circuit of present invention includes multiple memory cells, which may be arranged regularly into a cell array or block on a layout plane, and they might share a number of word lines and bit lines. For the conciseness of specification, only one memory cell C1 is shown in the circuit of FIG. 1 as an example, and other memory cells in the MRAM are considered as having identical or similar structure. As shown in FIG. 1, each memory cell C1 includes three transistors T1, T2, T3 and two storage devices MTJ1, MTJ2 (i.e. magnetic tunnel junction, MTJs). In addition, each memory cell C1 is provided with two bit lines BL1, BL2 and three word lines WL1-WL3. In the embodiment, the first transistor T1, the third transistor T3 and the second transistor T2 are connected in series connection, meaning their sources/drains are connected one by one with each other. In the aspect of circuit, the gates of first transistor T1, second transistor T2 and third transistor T3 are connected respectively to the first word line WL1, second word line WL2 and third word line WL3. These word lines are exactly the gates of corresponding transistors in actual structure.

Refer still to FIG. 1. In the embodiment, a junction of the first transistor T1 and third transistor T3 is first node N1 (or referred as storage node), a junction of the second transistor T2 and third transistor T3 is second node N2, and another terminals of the first transistor T1 and second transistor T2 are connected to a common source line SL. A first MTJ1 and a second MTJ2 are connected respectively on the first node N1 and second node N2. The two MTJs are components responsible for storing data in the MRAM of present invention. More specifically, in the embodiment of present invention, one terminal of the first MTJ1 is coupled to the first node N1 and another terminal of the first MTJ1 is coupled to a first bit line BL1. One terminal of the second MTJ2 is coupled to the second node N2 and another terminal of the second MTJ2 is coupled to a second bit line BL2. Furthermore, in the embodiment of present invention, every three word lines are considered as a group to control the switch of transistors for every memory cell in a corresponding memory row, while the source line may be shared by every memory cell in a corresponding memory column. Please note that the scheme of two MTJs shown in the figure is just an example. In other embodiment, each node might be provided with more than one series-connected MTJ in order to implement more storage states and achieve memory capacity in a given layout area.

After the architecture of MRAM circuit of the present invention is described as above, FIGS. 2-6 will now be referred sequentially in following embodiment to describe overlapping patterns of the components in actual layout plane of different levels in the MRAM of the present invention, in order to provide a better understanding of explicit structures of the MRAM of present invention for readers.

Figure 2:
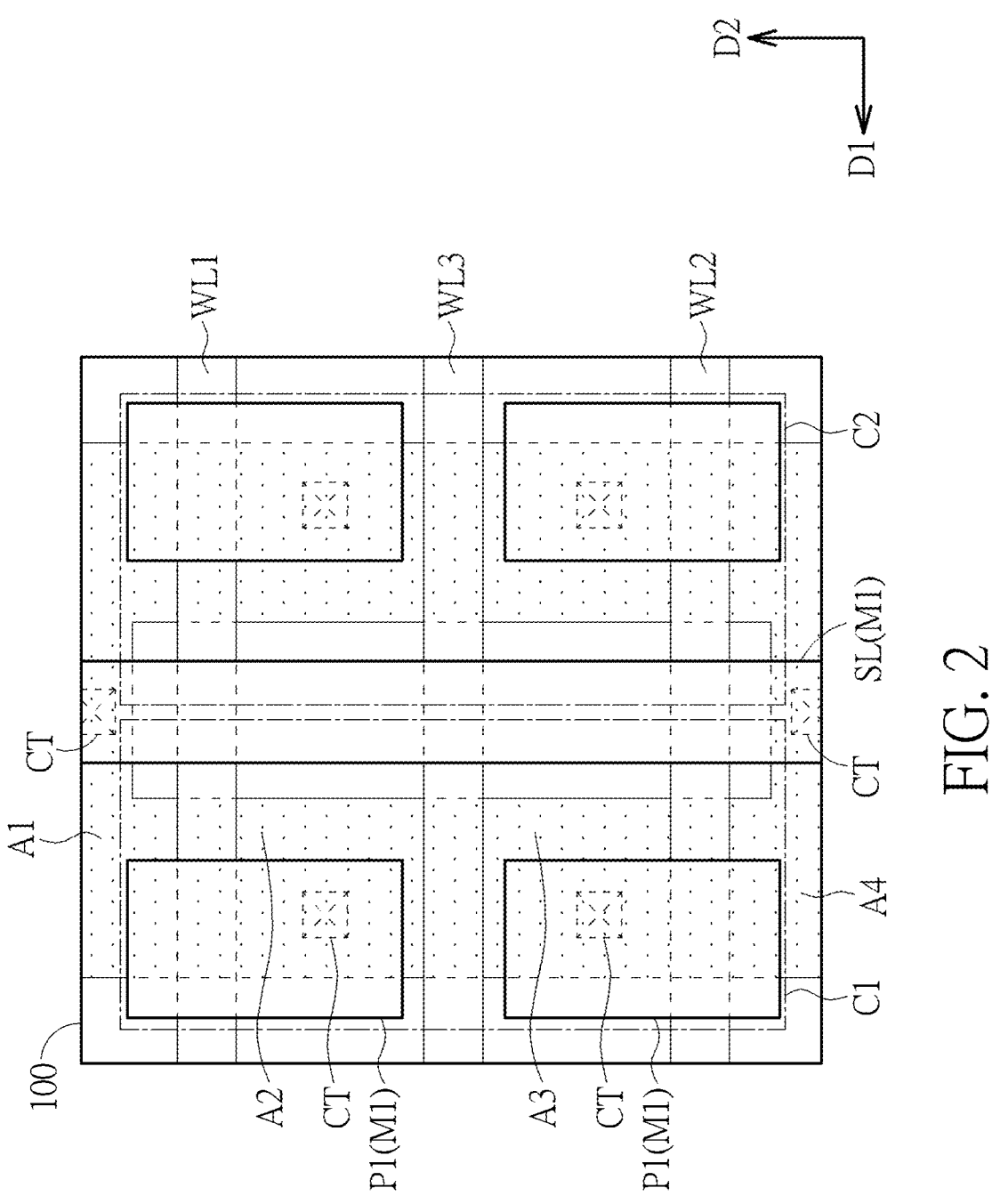
FIG. 2 is a layout of active areas and a first metal layer (M1) in the MRAM in accordance with the preferred embodiment of present invention.

Please refer to FIG. 2, which is a layout of active areas and a first metal layer (M1) of the MRAM in accordance with the preferred embodiment of present invention. As shown in the figure, the MRAM of present invention is set up on a semiconductor substrate 100. The substrate 100 may be a silicon substrate, multiple active areas with different conductivity may be formed therein beforehand through ion implantation process, and silicon oxide based shallow trench isolations (STIs) may be formed to isolate the active areas. Multiple word lines extend over the active areas, so that the active areas are divided into different active sub-areas. More specifically, take this embodiment for an example, a first word line WL1, a third word line WL3 and a second word line WL2 are arranged and spaced-apart in a second direction D2 and extending in a horizontal first direction D1 over multiple active areas, so that each active area may be divided into a first active area A1, a second active area A2, a third active area A3 and a fourth active area A4, wherein the second direction D2 is preferably perpendicular to the first direction D1. Among them, as shown in the figure, the active area at an outer side of the first word line WL1 is first active area A1, the active area between the first word line WL1 and third word line WL3 is second active area A2, the active area between the second word line WL2 and third word line WL3 is third active area A3, and the active area at an outer side of the second word line WL2 is fourth active area A4. The four active areas A1-A4 are arranged in the second direction D2 in order.

Refer still to FIG. 2. In the embodiment, the active areas A1-A4 function as sources or drains of transistors. More specifically, the first word line WL1 functions as a gate for the first transistor T1 (FIG. 1), with active areas A1, A2 at two sides respectively as the source and drain of first transistor T1. The second word line WL2 functions as a gate for the second transistor T2 (FIG. 1), with active areas A3, A4 at two sides respectively as the drain and source of second transistor T2. With respect to the third word line WL3, it functions as a gate for the third transistor T3 (FIG. 1), with active areas A2, A3 at two sides as the source and drain of third transistor T3. With this design, the first transistor T1 and the third transistor T3 (FIG. 1) share a common active area A2 (meaning the two transistors are in series connection), and the second transistor T2 and the third transistor T3 (FIG. 1) share a common active area A3 (meaning the two transistors are in series connection). In addition, the source of first transistor T1 or second transistor T2 (i.e. the first active area A1 or the fourth active area A4) of the two memory cells neighboring each other in the first direction D1 may be connected and shared. Take FIG. 2 for example, the first active area A1 or the fourth active area A4 of left memory cell C1 and right memory cell C2 may be connected and shared, meaning the first transistor T1 or second transistor T2 of the two memory cells C1, C2 share the same source, but not limited thereto.

Refer still to FIG. 2. A first metal layer M1 is provided above the semiconductor substrate 100 and the word lines WL1-WL3, which may be the first metal level in BEOL interconnects. In the embodiment, the first metal layer M1 includes a source line SL and multiple first patterns P1, wherein the source line SL is preferably between every two memory cells (ex. C1, C2) neighboring each other in the first direction D1 and extends in the second direction D2 over multiple word lines WL1-WL3. The patterns and features on the two memory cells may be in reflection symmetry with respect to the source line SL. The aforementioned first active area A1 or fourth active area A4 shared by the neighboring two memory cells C1, C2 may be connected upwardly and respectively to the source line SL in the first metal layer M1 through contacts CT. In another aspect, first patterns P1 may be provided respectively on the second active area A2 and the third active area A3 of memory cell, which may be in reflection symmetry with respect to the third word line WL3 and preferably not overlap the third word line WL3 in a direction vertical to the substrate. The second active area A2 and third active area A3 may be connected upwardly and respectively to the corresponding first patterns P1 in the first metal layer M1 through contacts CT, and be further connected to metal levels or structure further above through the first patterns P1.

Figure 3:
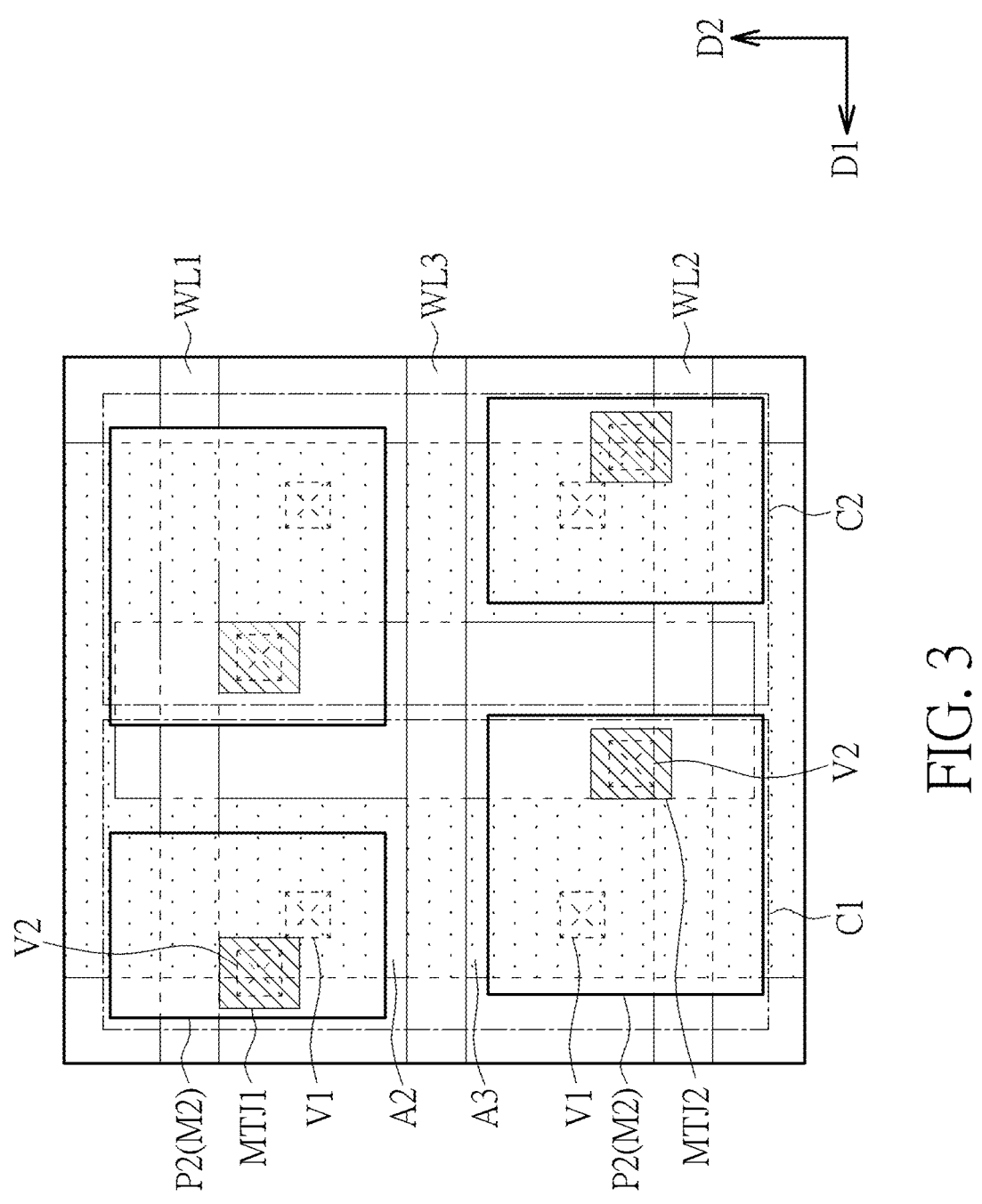
FIG. 3 is a layout of active areas, a second metal layer (M2) and MTJs in the MRAM in accordance with the preferred embodiment of present invention.

Please refer to FIG. 3, which is a layout of active areas, a second metal layer (M2) and MTJs in the MRAM in accordance with the preferred embodiment of present invention. Please note that the aforementioned first metal layer M1 is omitted in the figure in case of obscuring the layouts. Only the patterns of active areas, second metal layer and MTJs are shown. As shown in the figure, a second metal layer M2 is provided above the first metal layer M1, which may belong to one metal level of the BEOL interconnects. In the embodiment, the second metal layer M2 includes multiple second patterns P2. More specifically, second patterns P2 may be set respectively above the second active area A2 and third active area A3 of each memory cell, and it may be connected downwardly and respectively to the aforementioned corresponding first pattern P1 through vias V1. On the other hand, the second pattern P2 may be connected upwardly to a corresponding MTJ through via V2. For example, as far as the memory cell C1 is concerned, its second pattern P2 above the second active area A2 is connected downwardly to a first pattern P1 through a via V1, and be further connected downwardly to the second active area A2 through the first pattern P1 and a contact CT (FIG. 2). In addition, the second pattern P2 is connected upwardly to a first MTJ1 through a via V2. These connecting components are exactly the first node N1 in FIG. 1. Similarly, the second pattern P2 on the third active area A3 of memory cell C1 is connected downwardly to a first pattern P1 through a via V1, and be further connected downwardly to the third active area A3 through the first pattern P1 and a contact CT (FIG. 2). In addition, the second pattern P2 is connected upwardly to a second MTJ2 through a via V2. These connecting components are exactly the second node N2 in FIG. 1.

Refer still to FIG. 3. The MTJ1, MTJ2 function as storage devices in the MRAM structure, which are set preferably in BEOL metal interconnects and may be compatible and integrated into mature CMOS process nowadays. In the embodiment of present invention, the MTJ1, MTJ2 are preferably set in the level of via V2 between the second metal layer M2 and the third metal layer M3 (see FIG. 4, and they may be inserted in vias V2), and are connected to the metal levels or structure further above through vias V2, wherein the position of first MTJ1 on the layout plane is close to an outer side of memory cell in the first direction D1, while the position of second MTJ2 on the layout plane is close to the boundary between the two memory cells C1, C2 in the first direction D1. The positions of two MTJ2 in memory cells C1, C2 may even be designed to partially overlap each other in the second direction D2. This is the advantage and efficacy of scaling memory dimension resulted from the design of setting the bit lines of present invention in different levels, which will be explained in detail in following embodiment.

Figure 4:
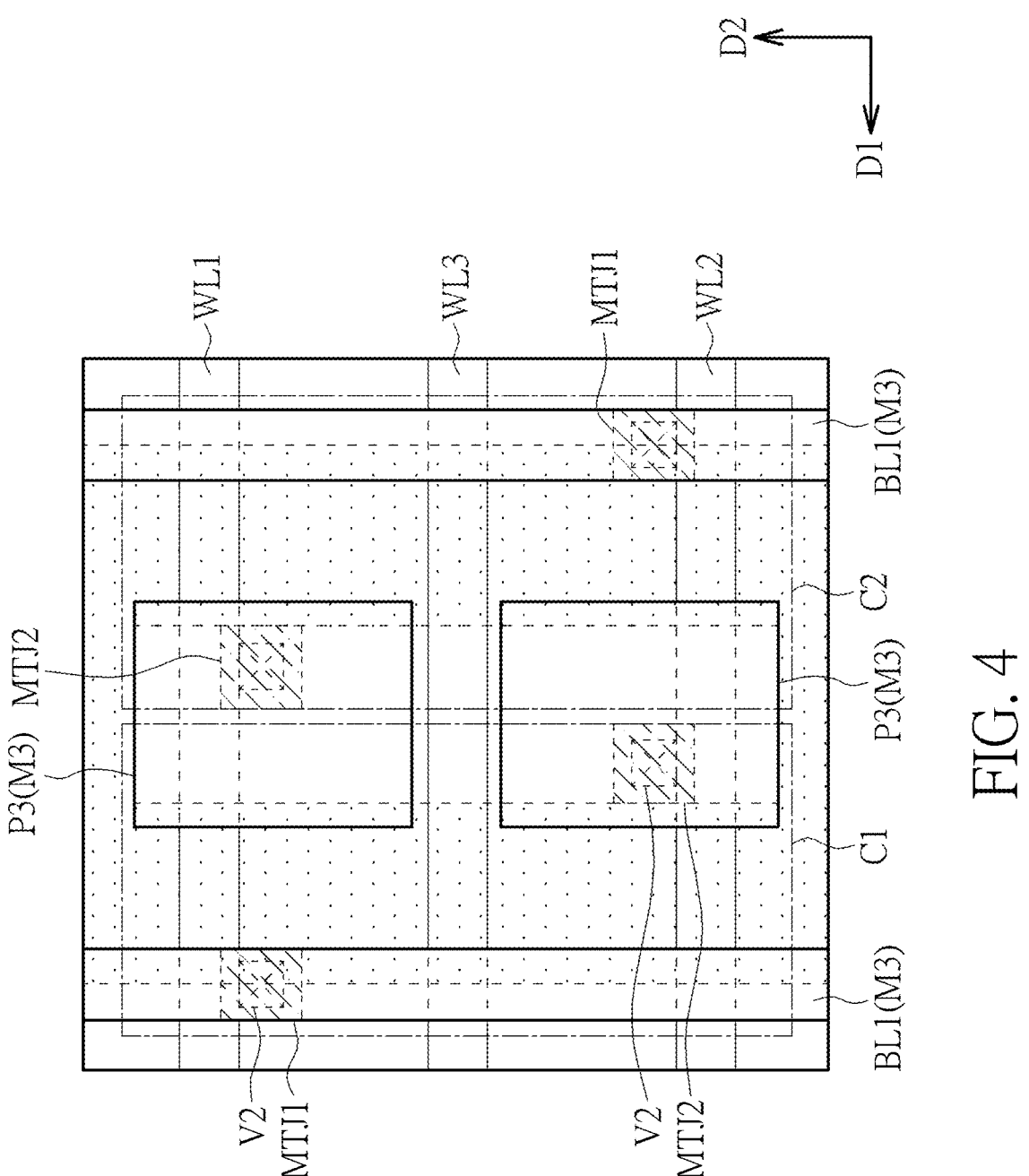
FIG. 4 is a layout of active areas and a third metal layer (M3) in the MRAM in accordance with the preferred embodiment of present invention.

Please refer to FIG. 4, which is a layout of active areas and a third metal layer (M3) in the MRAM in accordance with the preferred embodiment of present invention. Please note that the aforementioned first metal layer M1 and second metal layer M2 are omitted in the figure in case of obscuring the layouts. Only the patterns of active areas, third metal layer and MTJs are shown. As shown in the figure, a third metal layer M3 is provided above the second metal layer M2, which may belong to a metal level in BEOL interconnects. In the embodiment, the third metal layer M3 includes first bit lines BL1 and third patterns P3, wherein the third patterns P3 are preferably between every two memory cells (ex. C1, C2) neighboring each other in the first direction D1, and each memory will be provided with one of the corresponding third patterns P3. More specifically, two third patterns P3 are provided above the boundary (i.e. the position of source line SL in FIG. 2) between the memory cells C1, C2 in the embodiment, and they are in reflection symmetry with respect to the third word line WL3. Among them, the lower third pattern P3 in the figure belongs to memory cell C1, which follows the connection of second MTJ2 below close to the boundary between the two memory cells through a via V2. The upper third pattern P3 in the figure belongs to memory cell C2, which follows the connection of another second MTJ2 below close to the boundary between the two memory cells through a via V2. On the other hand, two first bit lines BL1 in the third metal layer M3 are set respectively at two outer sides of the two memory cell C1, C2, and they are in reflection symmetry with respect to the boundary of the two memory cells C1, C2 and extend in the second direction D2 over multiple word lines WL1-WL3. The first bit line BL1 follows the connection of first MTJ1 below close to the outer sides of the two memory cells. It can be seen in the figure that, in the embodiment of present invention, the second MTJ2 is not connected with a corresponding bit line in the third metal layer M3 like the MTJ1 in conventional skill. This is an essential technical feature in the present invention.

Figure 5:
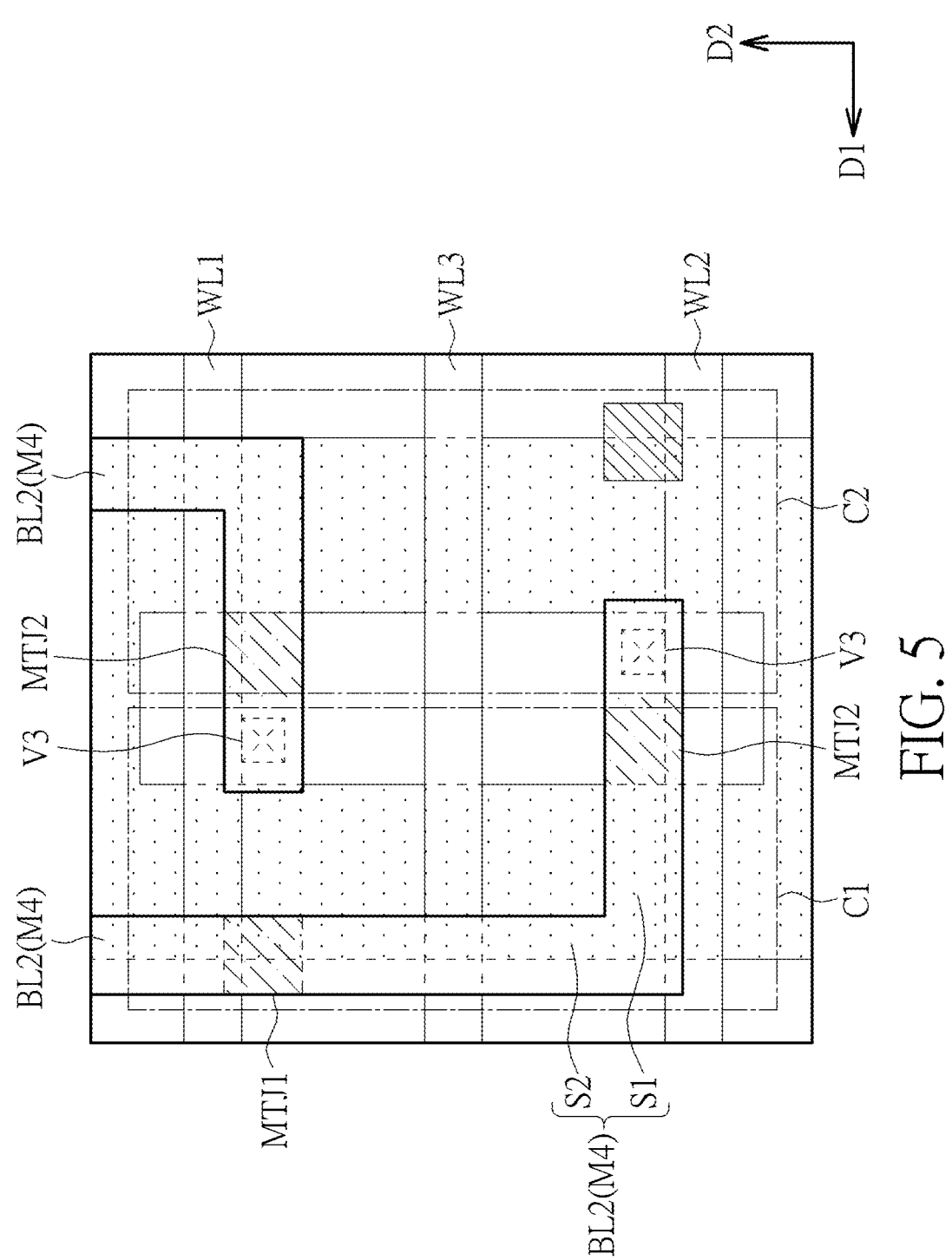
FIG. 5 is a layout of active areas and a fourth metal layer (M4) in the MRAM in accordance with the preferred embodiment of present invention.

Please refer to FIG. 5, which is a layout of active areas and a fourth metal layer (M4) in the MRAM in accordance with the preferred embodiment of present invention. Please note that the aforementioned first metal layer M1, second metal layer M2 and third metal layer M3 are omitted in the figure. Only patterns of the active areas, fourth metal layer and MTJs are shown in case of obscuring the layouts. As shown in the figure, a fourth metal layer M4 is provided above the third metal layer M3, which may belong to a metal level of the BEOL interconnects. In the embodiment, the fourth metal layer M4 includes only the pattern of second bit lines BL2. In the embodiment of present invention, the second bit line BL2 is bit line for connecting the aforementioned second MTJ2, and it is designedly different from the first bit line BL1, featuring a first segment S1 extending in the first direction D1 and a second segment S2 extending in the second direction D2, wherein the second segment S2 of second bit line BL2 may completely overlap or partially overlap the first bit line BL1 in the third metal layer M3 below. Both of them extend in the second direction D2 to external circuits, like a column decoder. One end of the first segment S1 of second bit line BL2 is connected with the second segment S2, and the other end of first segment S1 extends in the first direction D1 to a position above the third pattern P3 (FIG. 4) of third metal layer M3 at the boundary between the two memory cells C1, C2 (or above the second MTJ2), so that it may be connected therewith through a via V3.

Figure 6:
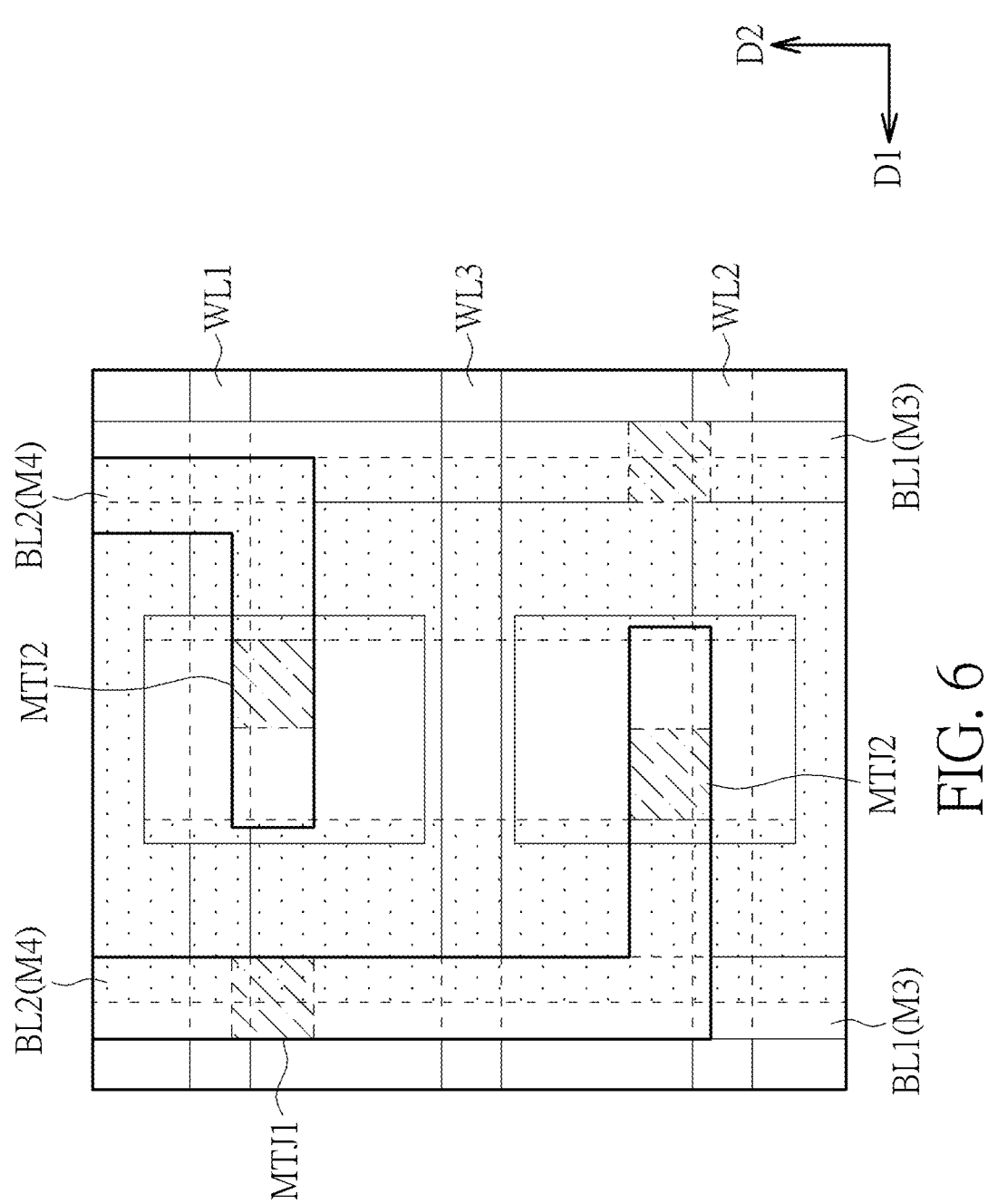
FIG. 6 is a layout of bit lines in different metal levels in accordance with the preferred embodiment of present invention.

Please refer now to FIG. 6, which clearly shows relative positions and overlapping relations of the aforementioned first bit lines BL1 and second bit lines BL2 in different metal levels on the layout plane. Through the layout scheme of MTJs and bit lines described in the aforementioned embodiment, it can be understood that in the embodiment of present invention, two MTJ1, MTJ2 in one memory cell will be connected respectively with a first bit line BL1 and a second bit line BL2 in different metal levels, wherein the first bit line BL1 and the second bit line BL2 substantially overlap each other in vertical direction, and the second bit line BL2 is provided with the additional first segment S1 extending in the first direction D1, which may trace the circuit of second bit line BL2 to the position of second MTJ2 in memory cell for connection. With this design, the first bit line BL1 and the second bit line BL2 are designed in different metal levels and need not to occupy layout plane area in the same level like the ones in conventional skill, so that the minimum design rule will not be violated, and the layout position of second MTJ2 will not be limited by the position of second bit line BL2 and may be modified and adapted to the dimension of memory cell. It can be seen in the figure that the positions of two second MTJ2 near the boundary between the memory cells C1, C2 can even be designed to partially overlap each other in the second direction D2, so that the miniaturization of memory cell may be realized accordingly, which is the efficacy and non-obviousness of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A MRAM layout with multiple memory cells, wherein each of said memory cells comprises:
   a substrate with multiple active areas formed thereon;
   a first word line, a third word line and a second word line spaced apart in a second direction on said substrate and extending in a first direction over said active areas, wherein said active area at an outer side of said first word line is first active area, said active area between said first word line and said third word line is second active area, said active area between said third word line and said second word line is third active area, and said active area at an outer side of said second word line is fourth active area;
   a first MTJ in BEOL metal layers with one terminal connected to said second active area and another terminal connected to one first bit line;
   a second MTJ in BEOL metal layer with one terminal connected to said third active area and another terminal connected to one second bit line, wherein said first bit line and said second bit line are in different metal levels of said BEOL metal layers; and
   a source line connected to said first active area and said fourth active area, wherein said source line, said first bit line and said second bit line extend in said second direction.

2. The MRAM layout of claim 1, wherein said BEOL metal layers comprises a first metal layer, a second metal layer, a third metal layer and a fourth metal layer sequentially and upwardly from said substrate in a direction vertical to said substrate, and said source line is in said first metal layer, said first bit line is in said third metal layer, said second bit line is in said fourth metal layer, and said first MTJ and said second MTJ are between said second metal layer and said third metal layer.

3. The MRAM layout of claim 2, wherein said second metal layer and said third metal layer are connected through vias, and said first MTJ and said second MTJ are respectively in one of said vias.

4. The MRAM layout of claim 2, wherein said first MTJ and said second MTJ are connected respectively to said second active area and said third active area through first patterns in said first metal layer, and two of said first patterns are at the same side of said source line and in reflection symmetry in said second direction with respect to said third word line.

5. The MRAM layout of claim 4, wherein said two first patterns are in reflection symmetry with said first patterns of another neighboring memory cell with respect to said source line in said first direction.

6. The MRAM layout of claim 4, wherein said source line is above a boundary between said memory cells, and said second MTJ and said second MTJ of another neighboring memory cell in said first direction overlap said source line in said vertical direction.

7. The MRAM layout of claim 2, wherein said first MTJ and said second MTJ are connected respectively to said second active area and said third active area through second patterns in said second metal layer, and said first MTJ and said second MTJ completely overlap with corresponding said second patterns in said vertical direction.

8. The MRAM layout of claim 2, wherein said third metal layer further comprises third patterns, and said second MTJ is connected to said third active area through one of said third pattern, and said third pattern completely overlap said second MTJ in said vertical direction.

9. The MRAM layout of claim 8, wherein said third pattern is in reflection symmetry with said third pattern of another neighboring memory cell in said first direction with respect to said third word line, and said first bit line and a first bit line of said another memory cell are in reflection symmetry with respect to said third pattern.

10. The MRAM layout of claim 2, wherein said second direction is perpendicular to said first direction, said second bit line is provided with a first segment extending in said first direction and a second segment extending in said second direction, and said second segment and said first bit line overlap each other in said vertical direction, and said first segment and said second MTJ overlap each other in said vertical direction.

11. The MRAM layout of claim 1, wherein said first active area is connected with a first active area of another neighboring memory cell in said first direction, and said fourth active area is connected with a fourth active area of said another memory cell.

* * * * *